(12) United States Patent
Kameyama et al.

(10) Patent No.: US 7,750,478 B2
(45) Date of Patent: Jul. 6, 2010

(54) SEMICONDUCTOR DEVICE WITH VIA HOLE OF UNEVEN WIDTH

(75) Inventors: Koujiro Kameyama, Ota (JP); Akira Suzuki, Ota (JP); Yoshio Okayama, Brookline, MA (US); Mitsuo Umemoto, Ora-gun (JP); Kenji Takahashi, Minato-ku (JP); Hiroshi Terao, Minato-ku (JP); Masataka Hoshino, Kawasaki (JP)

(73) Assignees: Sanyo Electric Co., Ltd., Osaka (JP); Kabushiki Kaisha Toshiba, Tokyo (JP); Fujitsu Microelectronics Limited, Tokyo (JP); NEC Corporation, Tokyo (JP)

( * ) Notice: Subject to any disclaimer, the term of this patent is extended or adjusted under 35 U.S.C. 154(b) by 0 days.

(21) Appl. No.: 11/808,667

(22) Filed: Jun. 12, 2007

(65) Prior Publication Data

US 2007/0249158 A1   Oct. 25, 2007

Related U.S. Application Data

(62) Division of application No. 11/055,707, filed on Feb. 11, 2005.

(30) Foreign Application Priority Data

Feb. 17, 2004  (JP)  .............................. 2004-040403

(51) Int. Cl.
 H01L 23/48  (2006.01)
 H01L 23/52  (2006.01)
 H01L 29/40  (2006.01)
(52) U.S. Cl. .................. 257/774; 257/758; 257/760; 257/E21.578; 257/E21.238

(58) Field of Classification Search ......... 257/758–760, 257/774, E21.578, E21.238
See application file for complete search history.

(56) References Cited

U.S. PATENT DOCUMENTS 4,097,890 A    6/1978   Morris et al.

(Continued)

FOREIGN PATENT DOCUMENTS

EP           1376678 A    1/2004

(Continued)

OTHER PUBLICATIONS

Microchip Fabrication, Peter Van Zant, McGraw-Hill, Fourth Edition, pp. 402-403.

(Continued)

*Primary Examiner*—Thanh V Pham
*Assistant Examiner*—Duy T Nguyen
(74) *Attorney, Agent, or Firm*—Morrison & Foerster LLP (57) ABSTRACT

A semiconductor device with improved reliability and its manufacturing method is offered. The semiconductor device of this invention includes a semiconductor substrate, a pad electrode formed on the semiconductor substrate through an insulation layer made of silicon oxide, silicon nitride or the like, a supporting plate bonded to a top surface of the semiconductor substrate to cover the pad electrode and a via hole formed in the semiconductor substrate and extending from a back surface of the semiconductor substrate to the pad electrode, wherein an aperture of the via hole at a portion close to the pad electrode is larger than an aperture of the via hole at a portion close to the back surface of the semiconductor substrate.

10 Claims, 6 Drawing Sheets

U.S. PATENT DOCUMENTS

| | | | |
|---|---|---|---|
| 4,964,212 | A | 10/1990 | Deroux-Dauphin et al. |
| 5,056,216 | A | 10/1991 | Madou et al. |
| 5,149,674 | A | 9/1992 | Freeman et al. |
| 5,229,647 | A | 7/1993 | Gnadinger |
| 5,248,903 | A | 9/1993 | Heim |
| 5,284,797 | A | 2/1994 | Heim |
| 5,397,907 | A | 3/1995 | Lee |
| 5,432,119 | A | 7/1995 | Le et al. |
| 5,739,587 | A | 4/1998 | Sato |
| 5,910,687 | A | 6/1999 | Chen et al. |
| 5,915,167 | A | 6/1999 | Leedy |
| 5,949,140 | A | 9/1999 | Nishi et al. |
| 5,985,749 | A | 11/1999 | Lin et al. |
| 6,020,217 | A | 2/2000 | Kuisl et al. |
| 6,031,293 | A | 2/2000 | Hsuan et al. |
| 6,204,074 | B1 | 3/2001 | Bertolet et al. |
| 6,242,813 | B1 | 6/2001 | Huang et al. |
| 6,281,448 | B1 | 8/2001 | Tsukamoto |
| 6,297,563 | B1 | 10/2001 | Yamaha |
| 6,323,546 | B2 | 11/2001 | Hsuan et al. |
| 6,391,770 | B2 | 5/2002 | Kosaki et al. |
| 6,562,709 | B1 | 5/2003 | Lin |
| 6,642,615 | B2 | 11/2003 | Hashimoto et al. |
| 6,716,737 | B2 | 4/2004 | Plas et al. |
| 6,720,661 | B2 * | 4/2004 | Hanaoka et al. ............. 257/774 |
| 6,734,568 | B2 | 5/2004 | Matsuo et al. |
| 6,746,953 | B2 | 6/2004 | Kramer et al. |
| 6,768,205 | B2 * | 7/2004 | Taniguchi et al. ............ 257/774 |
| 6,773,952 | B2 | 8/2004 | Armbrust et al. |
| 6,838,362 | B2 | 1/2005 | Mastromatteo et al. |
| 6,924,221 | B2 * | 8/2005 | Shen .......................... 438/618 |
| 6,943,442 | B2 | 9/2005 | Sunohara et al. |
| 7,045,896 | B2 | 5/2006 | Ahn |
| 7,094,701 | B2 | 8/2006 | Umemoto et al. |
| 7,101,735 | B2 | 9/2006 | Noma et al. |
| 7,114,251 | B2 | 10/2006 | Mashino |
| 7,214,615 | B2 | 5/2007 | Miyazawa |
| 7,247,939 | B2 | 7/2007 | Huang et al. |
| 7,339,273 | B2 | 3/2008 | Kameyama et al. |
| 2002/0025587 | A1 | 2/2002 | Wada |
| 2002/0070457 | A1 * | 6/2002 | Sun et al. ..................... 257/774 |
| 2003/0025173 | A1 | 2/2003 | Suminoe et al. |
| 2003/0045085 | A1 | 3/2003 | Taniguchi et al. |
| 2003/0137056 | A1 | 7/2003 | Taniguchi et al. |
| 2003/0160293 | A1 | 8/2003 | Iadanza |
| 2003/0230805 | A1 | 12/2003 | Noma et al. |
| 2004/0016942 | A1 | 1/2004 | Miyazawa et al. |
| 2004/0017419 | A1 | 1/2004 | Lai et al. |
| 2004/0045668 | A1 | 3/2004 | Iwasaki et al. |
| 2004/0046258 | A1 * | 3/2004 | Cronin et al. ................ 257/758 |
| 2004/0072413 | A1 | 4/2004 | Hashimoto et al. |
| 2004/0104485 | A1 | 6/2004 | Yokoyama |
| 2004/0137701 | A1 | 7/2004 | Takao |
| 2004/0137723 | A1 | 7/2004 | Noma et al. |
| 2004/0140563 | A1 | 7/2004 | Ahn |
| 2004/0188807 | A1 | 9/2004 | Hiraoka et al. |
| 2004/0251554 | A1 | 12/2004 | Masuda |
| 2005/0003649 | A1 | 1/2005 | Takao |
| 2005/0023700 | A1 | 2/2005 | Singh et al. |
| 2005/0167812 | A1 | 8/2005 | Yoshida et al. |
| 2005/0189637 | A1 * | 9/2005 | Okayama et al. ............. 257/679 |
| 2006/0033168 | A1 | 2/2006 | Umemoto et al. |
| 2006/0087042 | A1 | 4/2006 | Kameyama et al. |
| 2006/0108691 | A1 | 5/2006 | Kameyama et al. |
| 2006/0108695 | A1 | 5/2006 | Kameyama et al. |
| 2006/0202348 | A1 | 9/2006 | Kameyama et al. |
| 2008/0132038 | A1 | 6/2008 | Kameyama et al. |
| 2009/0124078 | A1 | 5/2009 | Kameyama et al. |

FOREIGN PATENT DOCUMENTS

| | | |
|---|---|---|
| EP | 1408547 | 4/2004 |
| EP | 1439576 | 7/2004 |
| EP | 1 564 805 A1 | 8/2005 |
| EP | 1 564 810 | 8/2005 |
| EP | 1564806 | 8/2005 |
| EP | 1653508 | 5/2006 |
| JP | 2002-348697 | 12/2002 |
| JP | 2003-309221 | 10/2003 |
| JP | 2004-296488 | 10/2004 |
| JP | 2005-5322 | 1/2005 |
| JP | 2005-183548 | 7/2005 |
| JP | 2005-268456 | 9/2005 |
| WO | WO-96/13062 A | 5/1996 |
| WO | WO-99/40624 A1 | 8/1999 |
| WO | WO-2004/064159 | 7/2004 |

OTHER PUBLICATIONS

European Office Action, dated Jul. 11, 2008, directed to related European Patent Application No. 05 002 897.6; 5 pages.

Microchip Fabrication, Peter Van Zant, McGraw-Hill, Fourth Edition, pp. 402-403, Apr. 3, 2000.

European Search Report, dated Jun. 25, 2009, directed to European Patent Application No. 06 00 4779.2; 8 pages.

European Search Report, dated Apr. 24, 2009, directed to related European Patent Application No. 05023408.7; (5 pages).

European Search Report, dated May 8, 2009, directed to related European Patent Application No. 05023409.5; (5 pages).

EP Search Report dated Jul. 10, 2009, directed to Application No. 05023408.7 (10 pages).

EP Search Report dated Aug. 4, 2009, directed to Application No. 05023591.01.

Kameyama et al., US Office Action mailed Jul. 9, 2007, directed to related U.S. Appl. No. 11/260,682; (8 pages).

Kameyama et al., US Office Action mailed Dec. 27, 2007, directed to related U.S. Appl. No. 11/260,682; (8 pages).

Kameyama et al., US Office Action mailed May 12, 2008, directed to related U.S. Appl. No. 11/260,682; (7 pages).

Kameyama et al., US Office Action mailed Oct. 29, 2008, directed to related U.S. Appl. No. 11/260,682; (6 pages).

Kameyama et al., US Office Action mailed Feb. 26, 2009, directed to related U.S. Appl. No. 11/260,682; (6 pages).

Kameyama et al., US Office Action mailed May 14, 2008, directed to related U.S. Appl. No. 11/257,406; (6 pages).

Kameyama et al., US Office Action mailed Nov. 13, 2008, directed to related U.S. Appl. No. 11/257,406; (9 pages).

Kameyama et al., US Office Action mailed Apr. 16, 2007, directed to related U.S. Appl. No. 11/257,390; (11 pages).

Kameyama et al., US Office Action mailed Apr. 23, 2009, directed to related U.S. Appl. No. 11/969,065; (7 pages).

Okayama et al., US Office Action mailed Jun. 29, 2006, directed to related U.S. Appl. No. 11/055,707; (6 pages).

Okayama et al., US Office Action mailed Nov. 21, 2006, directed to related U.S. Appl. No. 11/055,707; (10 pages).

Okayama et al., US Office Action mailed Aug. 9, 2007, directed to related U.S. Appl. No. 11/055,707; (15 pages).

Okayama et al., US Office Action mailed Jan. 28, 2008 directed to related U.S. Appl. No. 11/055,707; (15 pages).

Okayama et al., US Office Action mailed Sep. 3, 2008, directed to related U.S. Appl. No. 11/055,707; (15 pages).

Okayama et al., US Office Action mailed Feb. 6, 2009, directed to related U.S. Appl. No. 11/055,707; (19 pages).

Okayama et al., US Office Action mailed Aug. 3, 2009, directed to related U.S. Appl. No. 11/055,707; (11 pages).

Kameyama et al., US Office Action mailed Dec. 31, 2007, directed to related U.S. Appl. No. 11/362,503; (8 pages).

Kameyama et al., US Office Action mailed Jun. 8, 2009, directed to related U.S. Appl. No. 12/346,667; (12 pages).

Kameyama, K. et al., U.S Office Action mailed on Dec. 28, 2009 directed to related U.S. Appl. No. 12/346,667; 11 pages.

* cited by examiner

SEMICONDUCTOR DEVICE WITH VIA HOLE OF UNEVEN WIDTH

CROSS-REFERENCE OF THE INVENTION

This application is a divisional of U.S. application Ser. No. 11/055,707, filed Feb. 11, 2005, which is based on Japanese Patent Application No. 2004-040403, filed Feb. 17, 2004, the contents of which are incorporated herein by reference in their entireties.

BACKGROUND OF THE INVENTION

1. Field of the Invention

This invention relates to a semiconductor device and its manufacturing method specifically to a technology to form a via hole in a semiconductor substrate.

2. Description of the Related Art

A CSP (Chip Size Package) has received attention in recent years as a three-dimensional mounting technology as well as a new packaging technology. The CSP is a small package having about the same outside dimensions as those of a semiconductor die packaged in it.

A BGA type semiconductor device has been known as a type of CSP. A plurality of ball-shaped conductive terminals made of a metal such as solder is arrayed in a grid pattern on one principal surface of a package of the BGA type semiconductor device and is electrically connected with the semiconductor die mounted on the other side of the package.

When the BGA type semiconductor device is mounted on electronic equipment, the semiconductor die is electrically connected with an external circuit on a printed circuit board by bonding the conductive terminals to wiring patterns on the printed circuit board.

Such a BGA type semiconductor device has advantages in providing a large number of conductive terminals and in reducing a size over other CSP type semiconductor devices such as an SOP (Small Outline Package) and a QFP (Quad Flat Package), which have lead pins protruding from their sides. The BGA type semiconductor device is used as an image sensor chip for a digital camera incorporated into, for example, a mobile telephone.

Figure 9A:
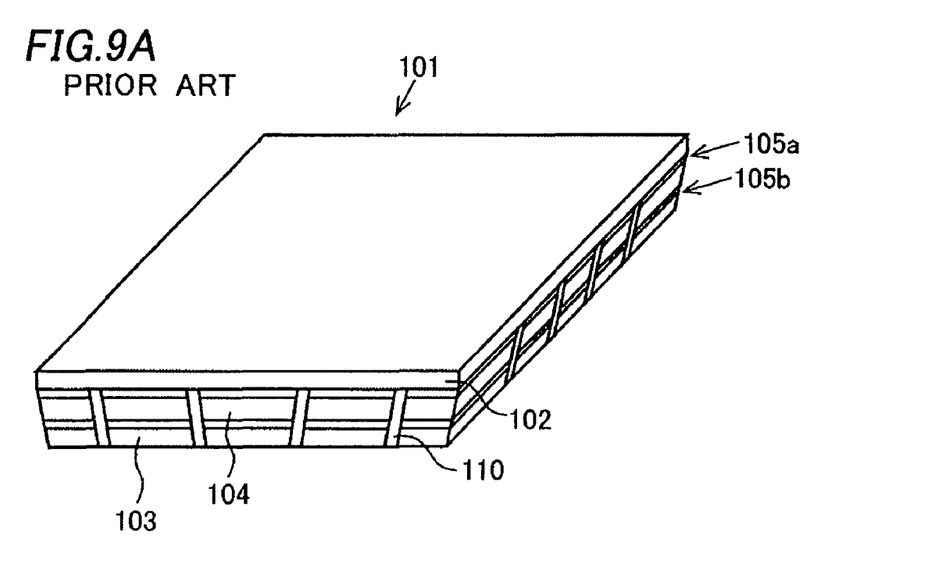
FIG. 9A and FIG. 9B are oblique perspective views showing a semiconductor device according to a prior art.
Figure 9B:
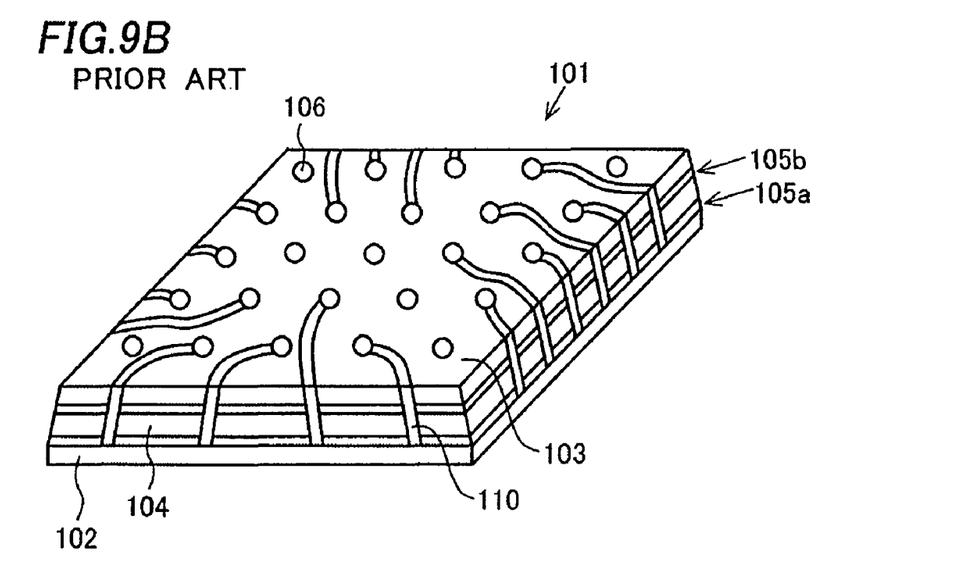

FIGS. 9A and 9B show the outline structure of a conventional BGA type semiconductor device. FIG. 9A is an oblique perspective figure of a front side of the BGA type semiconductor device. FIG. 9B is an oblique perspective figure of a back side of the BGA type semiconductor device.

A semiconductor die 104 is sealed between a first glass substrate 102 and a second glass substrate 103 through epoxy resin layers 105a and 105b in the BGA type semiconductor device 101. A plurality of conductive terminals 106 is arrayed in a grid pattern on a principal surface of the second glass substrate 103, that is, on a back surface of the BGA type semiconductor device 101. The conductive terminals 106 are connected to the semiconductor die 104 through a plurality of second wirings 110. The second wirings 110 are connected with first wirings of aluminum pulled out from inside of the semiconductor die 104, making each of the conductive terminals 106 electrically connected with the semiconductor die 104.

Figure 10:
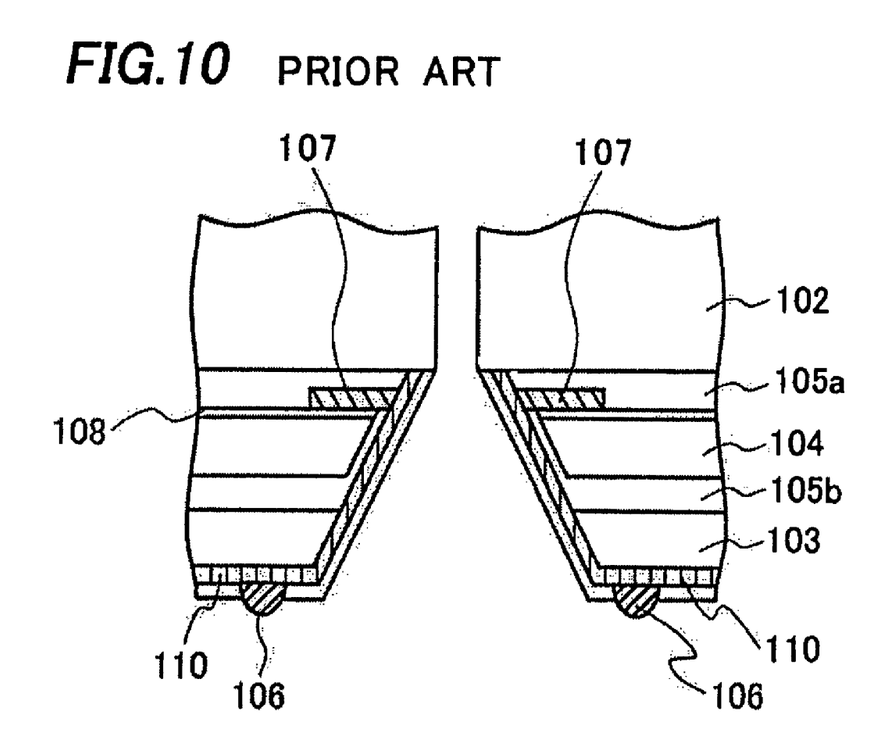
FIG. 10 is a cross-sectional view showing the semiconductor device according to the prior art.

Further explanation on a cross-sectional structure of the BGA type semiconductor device 101 is given hereafter referring to FIG. 10. FIG. 10 shows a cross-sectional view of the BGA type semiconductor devices 101 divided along dicing lines into individual dice.

A first wiring 107 is provided on an insulation layer 108 on a top surface of the semiconductor die 104. The semiconductor die 104 is bonded to the first glass substrate 102 with the resin layer 105a. The back surface of the semiconductor die 104 is bonded to the second glass substrate 103 with the resin layer 105b.

One end of the first wiring 107 is connected to the second wiring 110. The second wiring 110 extends from the end of the first wiring 107 onto a surface of the second glass substrate 103. And the ball-shaped conductive terminal 106 is formed on the second wiring 110 extended over the second glass substrate 103.

Relevant technology mentioned above is disclosed, for example, in Japanese Patent Application Publication No. 2002-512436.

However, there is a possibility that the first wiring 107 and the second wiring 110 are disconnected at the point of contact between them, since the area of the point of contact is very small in the semiconductor device 101 described above. Also there is a problem in step coverage of the second wiring 110.

SUMMARY OF THE INVENTION

This invention is directed to solve the problems addressed above and offers a semiconductor device with improved reliability and its manufacturing method.

The invention provides a semiconductor device that includes a semiconductor substrate having an insulation layer formed on its front surface, a pad electrode formed on the insulation layer, and a supporting member bonded to the front surface so as to cover the pad electrode. The semiconductor substrate has a via hole extending from a back surface of the semiconductor substrate to a surface of the pad electrode. A portion of the via hole that is closer to the front surface than to the back surface is wider than a portion of the via hole that is closer to the back surface than to the front surface.

The invention also provides a method of manufacturing a semiconductor device. The method includes providing a semiconductor substrate having an insulation layer formed on its front surface and a pad electrode formed on the insulation layer, bonding a supporting material to the front surface so as to cover the pad electrode, forming a via hole in the semiconductor substrate from a back surface of the semiconductor substrate so as to expose a surface of the pad electrode. The forming of the via hole includes forming a first portion of the via hole that does not reach the insulation layer and forming below the first portion a second portion of the via hole that is wider than the first portion and reaches the insulation layer.

DETAILED DESCRIPTION OF THE INVENTION

Next, a semiconductor device according to an embodiment of this invention and its manufacturing method will be described, referring to FIGS. 1-8, which are cross-sectional views showing device intermediates of the semiconductor device applicable to an image sensor.

Figure 1:
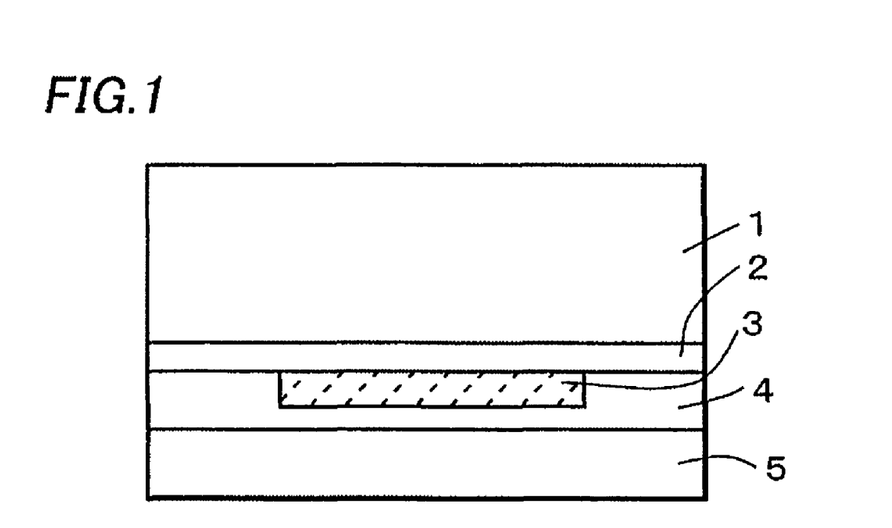
FIG. 1 is a cross-sectional view of a device intermediate at a process step of a method of manufacturing a semiconductor device according to an embodiment of this invention.

First, a pad electrode 3 made of aluminum or an aluminum alloy is formed on the front surface of a semiconductor substrate 1 through a first insulation layer 2 made of, for example, silicon oxide or silicon nitride, as shown in FIG. 1. Then a supporting plate 5 made of a glass, or the like, is bonded to the semiconductor substrate 1 having the pad electrode 3 through an adhesive layer 4 made of an epoxy resin. A tape-shaped protective material may be bonded to the semiconductor substrate 1 instead of the supporting plate 5, or a double-faced adhesive tape may be used as a supporting material.

Figure 2:
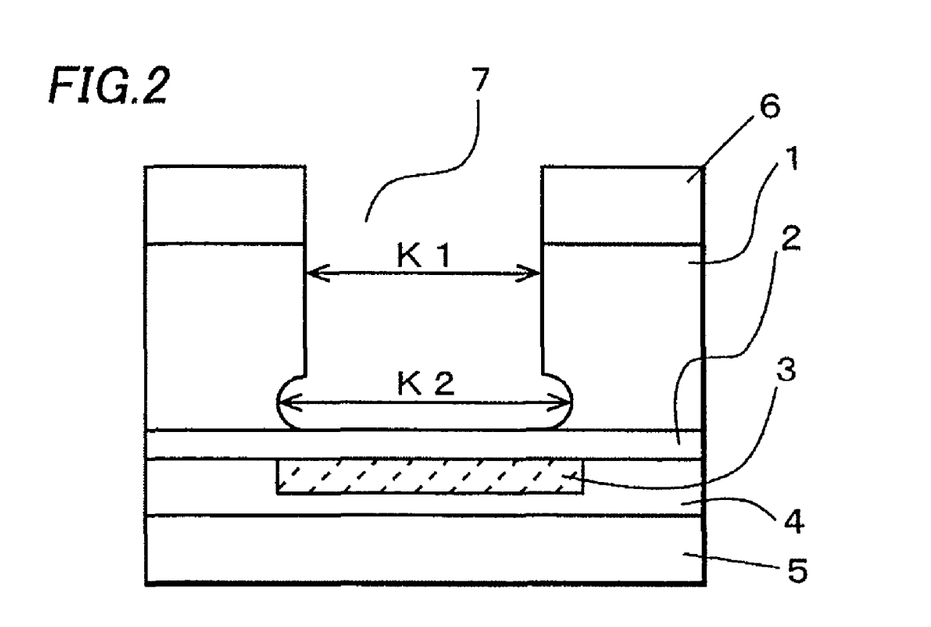
FIG. 2 is a cross-sectional view of a device intermediate at a process step following the step of FIG. 1.

Next, a photoresist layer 6 having an opening corresponding to the pad electrode 3 is formed on the back surface of the semiconductor substrate 1. The semiconductor substrate 1 is dry-etched using the photoresist layer 6 as a mask to form a first opening 7 in the semiconductor substrate 1 extending from the back surface of the semiconductor substrate 1 to the first insulation layer 2 on the pad electrode 3, as shown in FIG. 2. In this process, the semiconductor substrate 1 made of silicon is etched using an etching gas including $SF_6$, $O_2$ or fluorocarbon such as $C_2F_4$, $C_4F_8$ or $CHF_3$, or a combination thereof. When the semiconductor substrate 1 on the first insulation layer 2 is over-etched in the process, the first opening 7 is formed to have a larger aperture K2 in the portion close to the pad electrode 3 than an aperture K1 in the portion close to the back surface of the semiconductor substrate 1 (K1<K2). In other words, the first opening 7 extends laterally at its bottom portion to form a barrel-shape, due to a drift of plasma of the etching gas during the over-etching.

Figure 3:
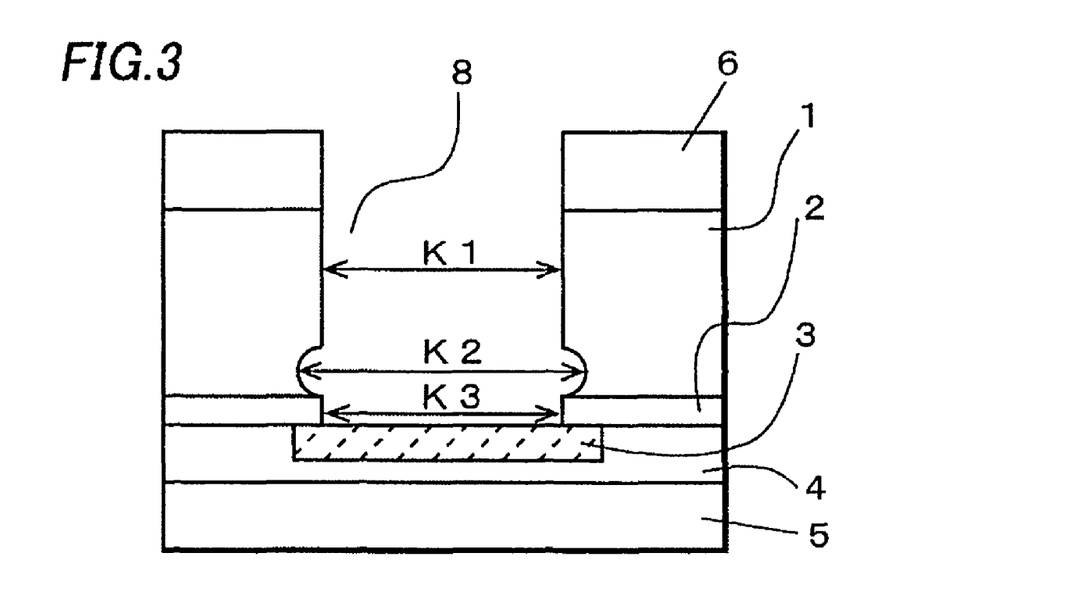
FIG. 3 is a cross-sectional view of a device intermediate at a process step following the step of FIG. 2.

Then the first insulation layer 2 on the pad electrode 3 is removed by etching using the photoresist layer 6 as a mask to expose the pad electrode 3 and form a via hole 8, as shown in FIG. 3. In this process, the first insulation layer 2 is etched using an etching gas including fluorocarbon such as $CHF_3$ or $CF_4$ diluted with argon, for example. Although the first opening 7 is widened in the bottom portion, the aperture K3 of the opening in the first insulation layer 2 on the pad electrode 3 is formed to have about the same size as the aperture of the via hole 8 at the upper portion, since the photoresist layer 6 and the upper portion of a sidewall of the opening 7 serve as a mask to prevent the etching gas from spreading laterally. The etching may be made without using the photoresist layer 6 as the mask. In this case, the first insulation layer 2 on the pad electrode 3 is removed by an etching using the semiconductor substrate 1 as a mask after the photoresist layer 6 is removed.

Figure 4:
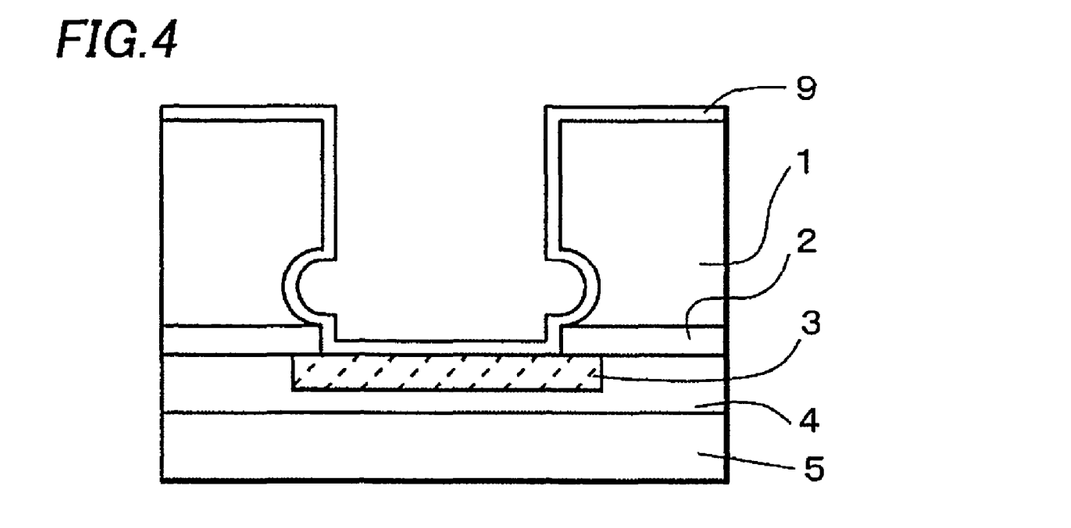
FIG. 4 is a cross-sectional view of a device intermediate at a process step following the step of FIG. 3.
Figure 5:
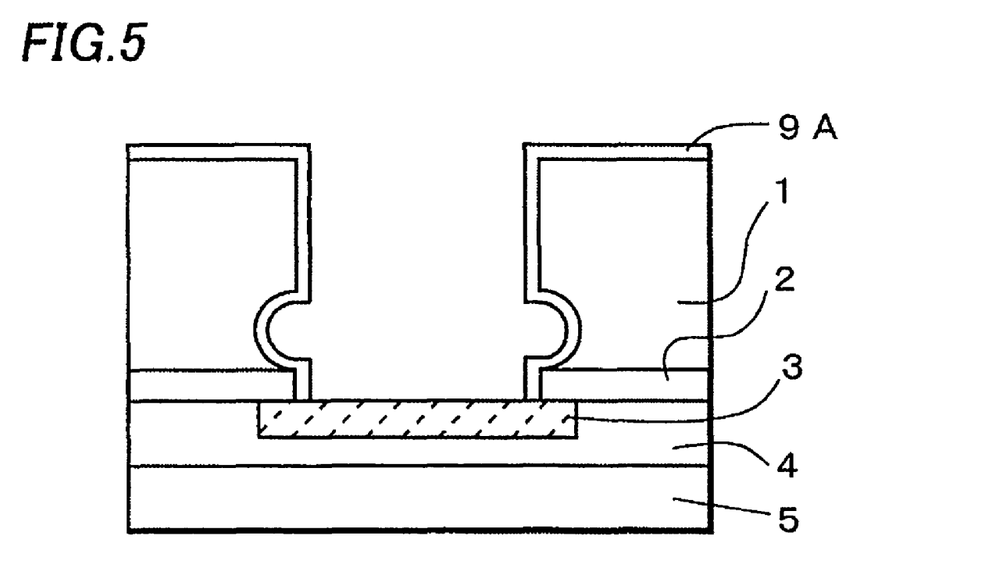
FIG. 5 is a cross-sectional view of a device intermediate at a process step following the step of FIG. 4.
Figure 6:
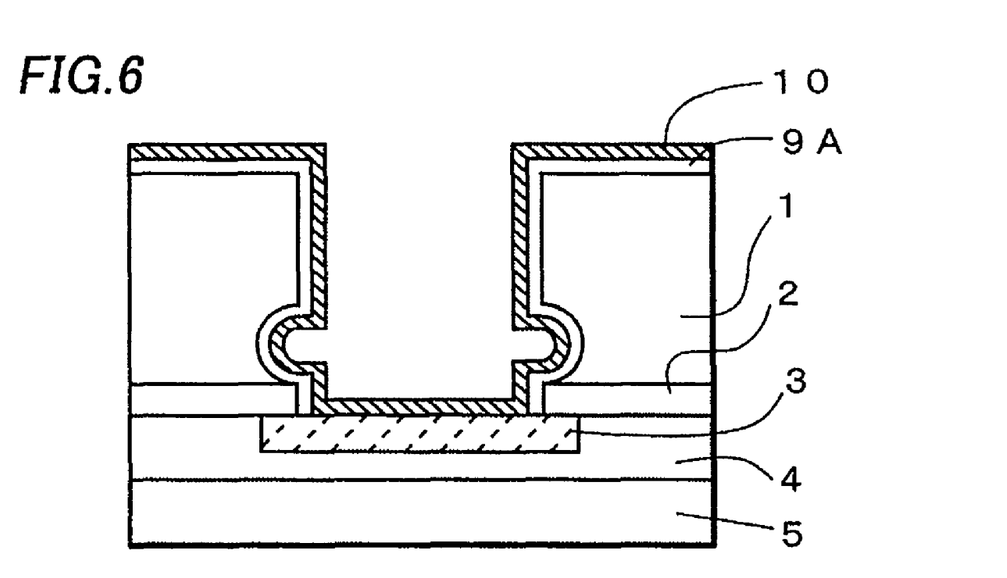
FIG. 6 is a cross-sectional view of a device intermediate at a process step following the step of FIG. 5.

Next, an insulation layer 9 made of silicon oxide or silicon nitride is formed on the back surface of the semiconductor substrate 1 and an inner surface of the via hole 8 as shown in FIG. 4, a portion of the insulation layer 9 on the pad electrode 3 is removed to form a second insulation layer 9A as shown in FIG. 5, and a barrier layer 10 is formed over the back surface of the semiconductor substrate 1 and the inner surface of the via hole 8, as shown in FIG. 6. The barrier layer 10 is preferably made of titanium nitride (TiN). Or it may be made of a refractory metal such as titanium (Ti) or tantalum (Ta), or a chemical compound of the refractory metal such as titanium tungsten (TiW) or tantalum nitride (TaN).

The second insulation layer 9A may be formed by removing the portion of the insulation layer 9 on the pad electrode 3 using a photoresist layer (not shown) formed over the semiconductor substrate as a mask. Or it may be formed by etching without using the photoresist layer as the mask.

The difference in thickness of the insulation layer 9 over the via hole 8 is utilized in the etching without using the photoresist layer as the mask. Although FIG. 4 shows the insulation layer 9 of a uniform thickness, the insulation layer 9 formed on the back surface of the semiconductor substrate 1 is, in practice, thicker than the insulation layer 9 formed at the bottom of the via hole 8. In this embodiment, the insulation layer 9 on the back surface of the semiconductor substrate 1 is twice as thick as the insulation layer 9 at the bottom of the via hole 9. Even when the photoresist layer is not formed over the semiconductor substrate 1, the insulation layer 9 on the pad electrode 3 can be completely removed before the insulation layer 9 on the back surface of the semiconductor substrate 1 is eliminated, taking advantage of the difference in the thickness.

Also, etching characteristics of the insulation layer 9 is taken into account in this embodiment. That is, the etch rate of the insulation layer 9 formed at the bottom of the via hole 8 is lower than the etch rate of the insulation layer 9 formed on the back surface of the semiconductor substrate 1. The etch rate of the insulation layer 9 formed on the back surface of the semiconductor substrate 1 is 1.5 times of the etch rate of the insulation layer 9 formed at the bottom of the via hole 8, for example. Therefore, the reliability of the manufacturing process is improved by utilizing both the difference in the thickness of the insulation layer 9 and the etching characteristics of the insulation layer 9.

Figure 7:
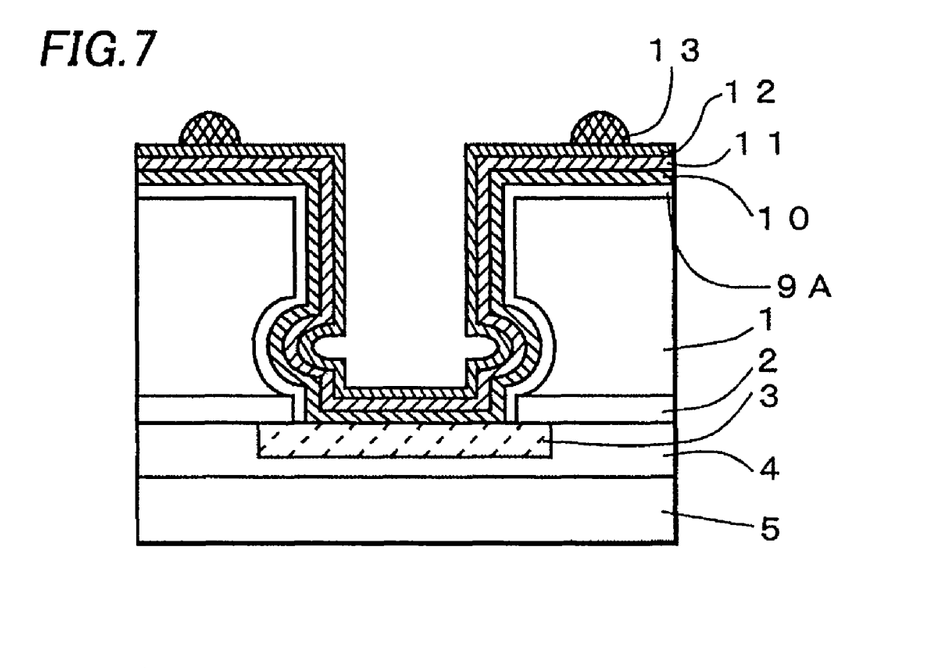
FIG. 7 is a cross-sectional view of a device intermediate at a process step following the step of FIG. 6.

A seed layer 11 (a Cu layer, or the like) is formed on the barrier layer 10 and a re-distribution layer 12 made of copper (Cu), or the like, is formed on the seed layer 11 by plating, as shown in FIG. 7. As a result, the re-distribution layer 12 is electrically connected with the pad electrode 3 and extends over the back surface of the semiconductor substrate 1 through the via hole 8. The re-distribution layer 12 may be either patterned or not patterned. After a protection layer (not shown) is formed on the re-distribution layer 12, openings are formed in predetermined locations in the protection layer and ball-shaped terminals 13 contacting the re-distribution layer 12 are formed in the openings.

The barrier layer 10 and the seed layer 11 may be formed by MOCVD (Metal Organic Chemical Vapor Deposition). However, it increases the production cost. A directional sputtering such as long-throw sputtering is less expensive than the MOCVD and is capable of improving coverage compared with conventional sputtering. By using the directional sputtering, the barrier layer 10 and the seed layer 11 can be formed with a good coverage even when the via hole has a slope of less than 90 degrees or an aspect ratio of three or higher.

Then, the semiconductor substrate 1 and the layers stacked on it are cut into individual semiconductor dice, although not shown in the figure. A BGA type semiconductor device, in which the pad electrode 3 and the ball-shaped terminal 13 are electrically connected, is formed as described above.

According to this invention, the second insulation layer 9A, the barrier layer 10, the seed layer 11 and the re-distribution layer 13 formed on the sidewall of the via hole 8 are strongly adhered to the semiconductor substrate 1 and hardly detached from the semiconductor substrate 1, because the layers are mechanically engaged with the semiconductor substrate 1 at the extended-aperture portion of the via hole 8 formed by the lateral etching in the lower portion of the opening. In addition, the connection between the pad electrode 3 made of aluminum or aluminum alloy, the seed layer 11 and the re-distribution layer 12 made of copper is improved.

Furthermore, the extended aperture of the via hole 8 formed above the pad electrode 3 relaxes the stresses generated in the seed layer 11 and the re-distribution layer 12 subsequently formed in the via hole 8, leading to improved reliability.

Figure 8:
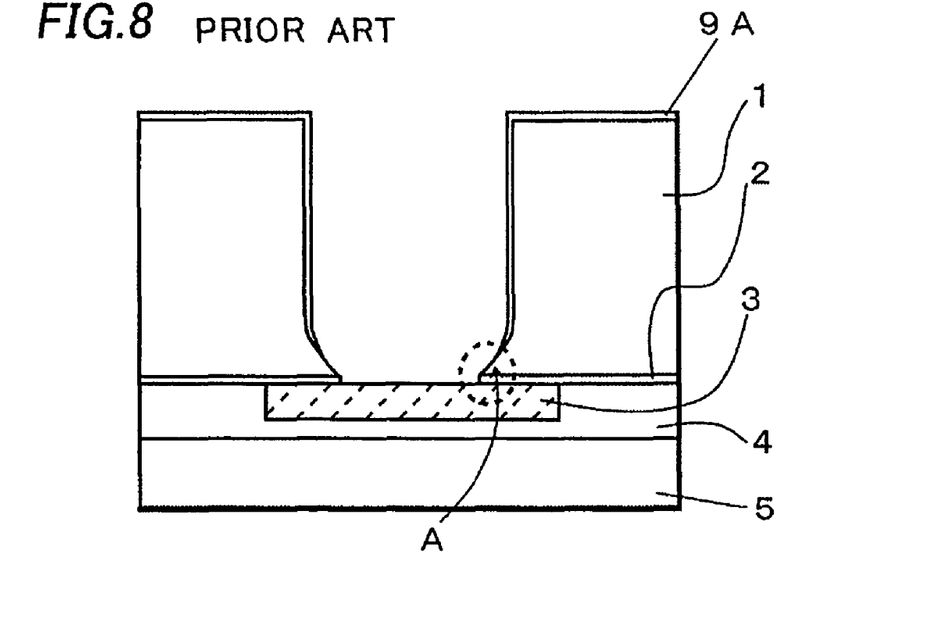
FIG. 8 is a cross-sectional view showing a semiconductor device intermediate according to a prior art.

When the sidewall of the via hole is straight or tapered down toward the bottom or trailing at the bottom as shown in FIG. 8, the second insulation layer 9A covering a sloped portion (portion A in FIG. 8) at the bottom of the via hole may become extremely thin, or disconnected, during the etching to remove the insulation layer at the bottom of the via hole, leading to the decline in insulation at the portion. There is no such removal of the insulation layer and resulting insulation failure in the via hole according to this invention.

Since the connection between the pad electrode on the semiconductor die and the conductive terminal is made through the via hole, the disconnection and the decline in step coverage of the connection are prevented. Thus a highly reliable BGA type semiconductor device is made available.

The re-distribution layer 12 is not necessarily made by plating as described in the embodiment. The re-distribution layer 12 may also be made, for example, without forming the seed layer 11 by a method other than the plating. It may be made by sputtering of, for example, aluminum or aluminum alloy.

This embodiment is not limited to the semiconductor device in which the ball-shaped terminals 13 are formed as described above. The embodiment may also be applied to a semiconductor device not having the ball-shaped terminals, such as a LGA (Land Grid Array) type semiconductor device, as long as a via hole is formed to penetrate a semiconductor substrate.

Since the connection between the pad electrode on the semiconductor die and the conductive terminal is made through the via hole, the disconnection and the decline in step coverage of the connection are prevented. Thus a highly reliable semiconductor device is made available.

In addition, because the vial hole extending from the back surface of the semiconductor substrate to the pad electrode is formed to have the larger aperture at the portion close to the pad electrode than the aperture at the portion close to the back surface of the semiconductor substrate, the second insulation layer or the metal layer formed on the sidewall of the via hole has a strong grip on the semiconductor substrate at the extended-aperture portion of the via hole and is less likely to come apart from the semiconductor substrate, leading to an improved electrical and mechanical connection between the pad electrode and the metal layer.

In addition, when the via hole is filled with a metal in a subsequent process step, the stresses generated in the metal layer are relaxed because the via hole has the larger aperture at the portion close to the pad electrode.

What is claimed is:

1. A semiconductor device comprising:
   a monolithic silicon substrate comprising a front surface and a back surface and having a via hole connecting the front and back surfaces;
   a pad electrode disposed on the front surface to cover the via hole;
   a first insulation layer disposed between the pad electrode and the front surface of the substrate;
   a supporting member disposed on the front surface to cover the pad electrode and the first insulation layer;
   a second insulation layer disposed on a sidewall of the via hole; and
   a metal layer disposed in the via hole and on the second insulation layer,
   wherein the via hole comprises a first via hole portion extending from the front surface and a second via hole portion extending from the back surface, and a sidewall of the first via hole portion recedes from a point where the first and second insulation layers and the substrate meet so as to form a semicircular recess in the sidewall of the first via hole portion in a cross-sectional view of the semiconductor device.

2. The semiconductor device of claim 1, wherein the second insulation layer is curved to follow the substantially semicircular recess in the sidewall of the first via hole portion.

3. The semiconductor device of claim 2, wherein the metal layer is curved to follow the curved second insulation layer.

4. The semiconductor device of claim 1, wherein the metal layer in the via hole engages with the substantially semicircular recess to achieve an adhesion between the metal layer and the substrate.

5. The semiconductor device of claim 1, wherein the sidewall of the first via hole portion curves so as to reduce stresses generated in the metal layer.

6. A semiconductor device comprising:
   a monolithic silicon substrate comprising a front surface and a back surface and having a via hole connecting the front and back surfaces;
   a pad electrode disposed on the front surface to cover the via hole;
   a first insulation layer disposed between the pad electrode and the front surface of the substrate;
   a second insulation layer disposed on a sidewall of the via hole; and
   a metal layer disposed in the via hole and on the second insulation layer,
   wherein the via hole comprises a first via hole portion extending from the front surface and a second via hole portion extending from the back surface, and a sidewall of the first via hole portion recedes from a point where the first and second insulation layers and the substrate meet so as to form a semicircular recess in the sidewall of the first via hole portion in a cross-sectional view of the semiconductor device.

7. The semiconductor device of claim 1, wherein the second insulation layer and the metal layer follow the substantially semicircular recess in the sidewall of the first via hole portion so as not fill the via hole fully and to form a receding portion corresponding to the substantially semicircular recess in the sidewall of the first via hole portion.

8. The semiconductor device of claim 6, wherein the second insulation layer and the metal layer follow the substantially semicircular recess in the sidewall of the first via hole portion so as not fill the via hole fully and to form a receding portion corresponding to the substantially semicircular recess in the sidewall of the first via hole portion.

9. The semiconductor device of claim 1, wherein a sidewall of the second via hole portion is substantially perpendicular to the front and back surfaces of the substrate.

10. The semiconductor device of claim 6, wherein a sidewall of the second via hole portion is substantially perpendicular to the front and back surfaces of the substrate.

* * * * *